United States Patent
Wu et al.

(10) Patent No.: US 7,053,627 B2
(45) Date of Patent: *May 30, 2006

(54) IMPEDANCE STANDARD SUBSTRATE AND METHOD FOR CALIBRATING VECTOR NETWORK ANALYZER

(75) Inventors: Sung Mao Wu, Kaohsiung (TW); Chi Tsung Chiu, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 11/048,840

(22) Filed: Feb. 3, 2005

(65) Prior Publication Data

US 2005/0127923 A1    Jun. 16, 2005

Related U.S. Application Data

(62) Division of application No. 10/667,513, filed on Sep. 23, 2003.

(30) Foreign Application Priority Data

Oct. 9, 2002 (TW) ............................... 91123644 A
Feb. 24, 2003 (TW) ............................... 92103976 A

(51) Int. Cl.
*G01R 35/00* (2006.01)
*G01D 18/00* (2006.01)

(52) U.S. Cl. ........................................ 324/601; 702/85

(58) Field of Classification Search ................ 324/601, 324/600, 130, 202, 74, 76.11, 754–758, 158.1; 702/57, 65, 91, 117, 168, 85; 361/763, 783, 361/792–795; 174/259–261, 52.4; 257/778–780; 439/66

See application file for complete search history.

(56) References Cited

U.S. PATENT DOCUMENTS

| | | | |
|---|---|---|---|
| 4,858,160 A | 8/1989 | Strid et al. | |
| 5,047,752 A | 9/1991 | Schorn | |
| 5,477,137 A * | 12/1995 | Staudinger et al. | 324/158.1 |
| 5,578,932 A * | 11/1996 | Adamian | 324/601 |
| 5,587,934 A * | 12/1996 | Oldfield et al. | 702/85 |
| 5,828,126 A * | 10/1998 | Thomas | 257/695 |
| 5,841,190 A * | 11/1998 | Noda et al. | 257/678 |
| 5,953,816 A * | 9/1999 | Pai et al. | 29/879 |
| 6,057,175 A * | 5/2000 | Milla et al. | 438/113 |
| 6,323,118 B1 * | 11/2001 | Shih et al. | 438/624 |
| 6,348,804 B1 | 2/2002 | Evers | |
| 6,362,438 B1 * | 3/2002 | Chong et al. | 174/262 |
| 6,545,353 B1 * | 4/2003 | Mashino | 257/724 |
| 6,643,597 B1 * | 11/2003 | Dunsmore | 702/104 |
| 2004/0138844 A1 * | 7/2004 | Wu et al. | 702/107 |
| 2004/0150411 A1 * | 8/2004 | Liu et al. | 324/601 |
| 2005/0037649 A1 * | 2/2005 | LaMeres et al. | 439/169 |

* cited by examiner

*Primary Examiner*—Anjan Deb
*Assistant Examiner*—Hoai-An D. Nguyen

(57) ABSTRACT

An impedance standard substrate for calibrating a vector network analyzer comprises a first surface and a second surface opposite to the first surface. A thru-circuit has two contacts electrically connected to each other. The two contacts are disposed on the first surface and the second surface, respectively. The impedance standard substrate further comprises a pair of open-circuits, a pair of short-circuits, and a pair of load-circuits disposed on the first surface and the second surface, respectively.

11 Claims, 5 Drawing Sheets

IMPEDANCE STANDARD SUBSTRATE AND METHOD FOR CALIBRATING VECTOR NETWORK ANALYZER

RELATED APPLICATIONS

This application is a divisional of U.S. patent application Ser. No. 10/667,513, filed Sep. 23, 2003.

BACKGROUND OF THE INVENTION

1. Field of the Invention

The present invention relates to an impedance standard substrate for a vector network analyzer, and more specifically, the present invention relates to an impedance standard substrate for a vector network analyzer, which is provided with contacts disposed on opposite sides thereof.

2. Description of the Related Art

Vector network analyzer is well known, for example, such as those disclosed in U.S. Pat. No. 6,348,804 entitled "Vector Network Analyzer," U.S. Pat. No. 5,047,752 entitled "Verification And Correction Method For An Error Model For A Measurement Network," and U.S. Pat. No. 4,858,160 entitled "System For Setting Reference Reactance For Vector Corrected Measurements."

Those vector network analyzer mainly utilizes one or two RF (Radio Frequency) sources for generating high-frequency signals, and two measuring ports for transmitting the signals to a DUT (Device Under Test). In a test set, directional couplers or directional bridges are used to separate the signals sent to the DUT, i.e. incident signals, and the signals reflected from the DUT, i.e. reflective signals. Both of the incident signals and the reflective signals are converted to low-frequency signals by a downconverter consisting of a local source and a mixer, and then the processes such as filtering and amplifying the signals, converting to digital signals and displaying the measuring data are carried out.

High-frequency measurements require highly accurate measurements of complex (magnitude and phase) reflection and transmission coefficients. The measurement system is calibrated by complex error factors.

These error factors are conventionally determined by measuring the known impedance standards. Although different impedance standards may be used, the ones most commonly employed are the open-circuit, short-circuit, load-circuit, and thru-circuit. The measuring port of the vector network analyzer is provided with a probe for respectively touching the contacts of the open-circuit, short-circuit, load-circuit, and thru-circuit, thereby determining the error factors and calibrating the vector network analyzer.

Those impedance standards are typically disposed on a single surface of a substrate which is referred to as an impedance standard substrate. However, in practical measurement of a DUT such as a BGA (ball grid array) substrate of a BGA package, since the BGA substrate has contacts disposed on two sides thereof, one of the probes in the vector network analyzer has to be turned by 180 degrees for measuring the BGA substrate after the measurement on the single surface of the impedance standard substrate has been done. Particularly, for the thru-circuit, the two probes of the vector network analyzer have to be in contact with either end of the thru-circuit at the same time and the impedance standard substrate in prior art is not provided with contacts disposed on both sides thereof, so such a turning action of the probes cannot be avoided. Such a turning action not only requires a complex mechanism, but also influences the preciseness of the measurement.

Accordingly, there exists a need for a two-side impedance standard substrate with impedance standard contacts disposed on both sides of the substrate for facilitating the calibration of the vector network analyzer.

SUMMARY OF THE INVENTION

It is an object of the present invention to provide a two-side impedance standard substrate with impedance standard contacts disposed on both sides of the substrate for facilitating the calibration of the vector network analyzer.

It is another object of the present invention to provide a method for calibrating a vector network analyzer for measuring a DUT with two-side contacts.

In order to achieve the above objects, the present invention provides an impedance standard substrate for calibrating a vector network analyzer comprising a first surface and a second surface opposite to the first surface. A thru-circuit has two contacts electrically connected to each other. The two contacts are disposed on the first surface and the second surface, respectively. The impedance standard substrate further comprises a pair of open-circuits, a pair of short-circuits, and a pair of load-circuits disposed on the first surface and the second surface, respectively.

The present invention further provides a method for calibrating a vector network analyzer comprising the steps of: providing an impedance standard substrate which comprises a first surface and a second surface opposite to the first surface; providing a thru-circuit having two contacts electrically connected to each other and respectively disposed on the first surface and the second surface; and driving the two probes to be in contact with the two contacts respectively, and sending the measuring signal. The method further comprises the steps of: providing a pair of open-circuits, a pair of short-circuits, and a pair of load-circuits disposed on the first surface and the second surface, respectively; and driving the two probes to be in contact with the open-circuits, the short-circuits, and the load-circuits, respectively, and sending the measuring signal.

Accordingly, the vector network analyzer can use the impedance standard substrate according to the present invention to obtain the two-side calibration data so as to directly measure the DUT with two-side contacts. The vector network analyzer is not required to turn the probe by means of complex mechanisms and the calibration data measured is comparatively correct.

BRIEF DESCRIPTION OF THE DRAWINGS

Other objects, advantages, and novel features of the invention will become more apparent from the following detailed description when taken in conjunction with the accompanying drawing.

DESCRIPTION OF THE EMBODIMENT

Figure 1:
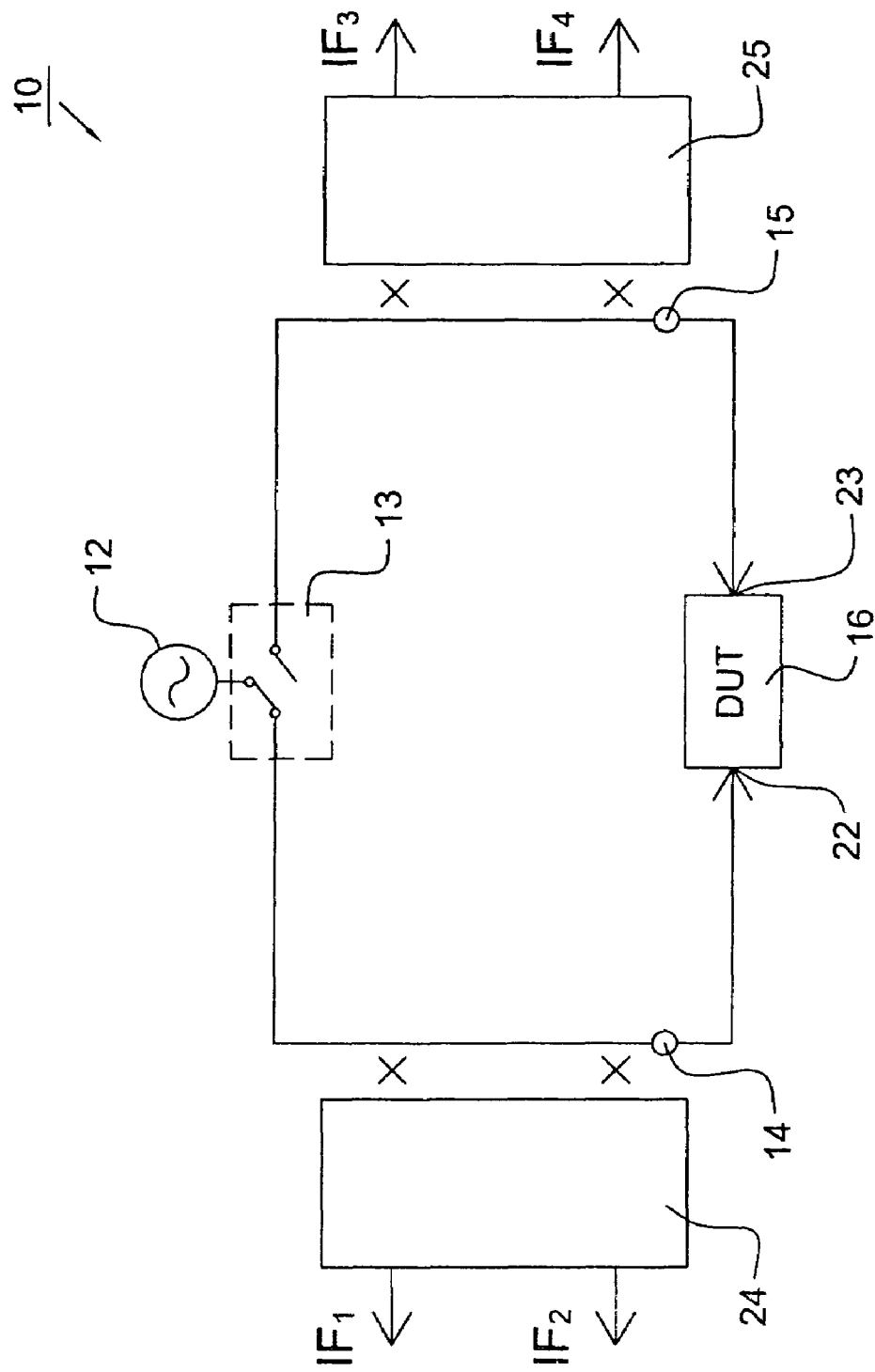
FIG. 1 is a system block diagram of a vector network analyzer.

Referring to FIG. 1, it depicts a vector network analyzer 10 according to the present invention. The vector network analyzer 10 comprises a RF (Radio Frequency) source 12 for generating high-frequency signals. The RF source 12 is alternately connected to two separate measuring ports 14, 15. The two measuring ports 14, 15 are respectively provided with probes 22, 23 connected to a DUT (Device Under Test) 16 for sending the high-frequency signals to DUT 16. Test sets 24, 25 of the vector network analyzer 10 then separate the high-frequency signals sent to DUT 16 and the signals reflected from the DUT 16 and process those signals for measuring the DUT 16.

Figure 2A:
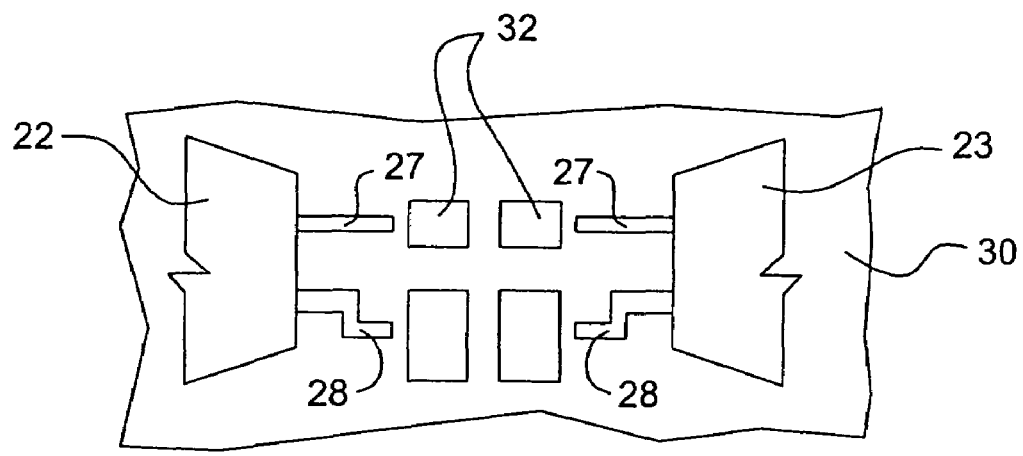
FIGS. 2a–d are schematic views of impedance standard circuits according to an embodiment of the present invention.
Figure 2B:
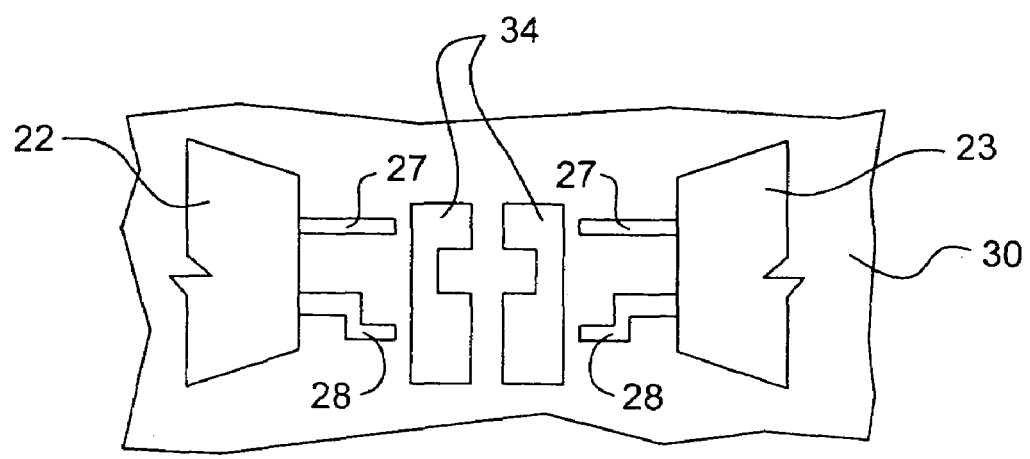
Figure 2C:
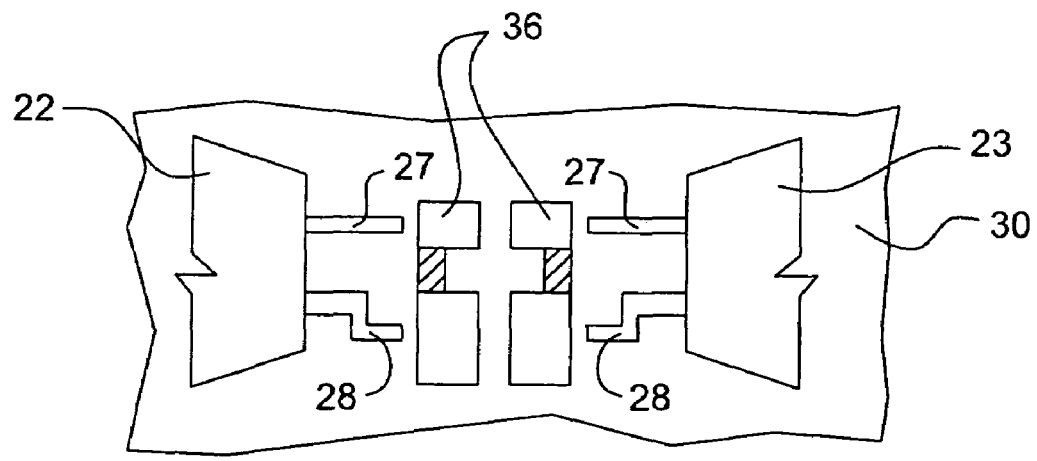
Figure 2D:
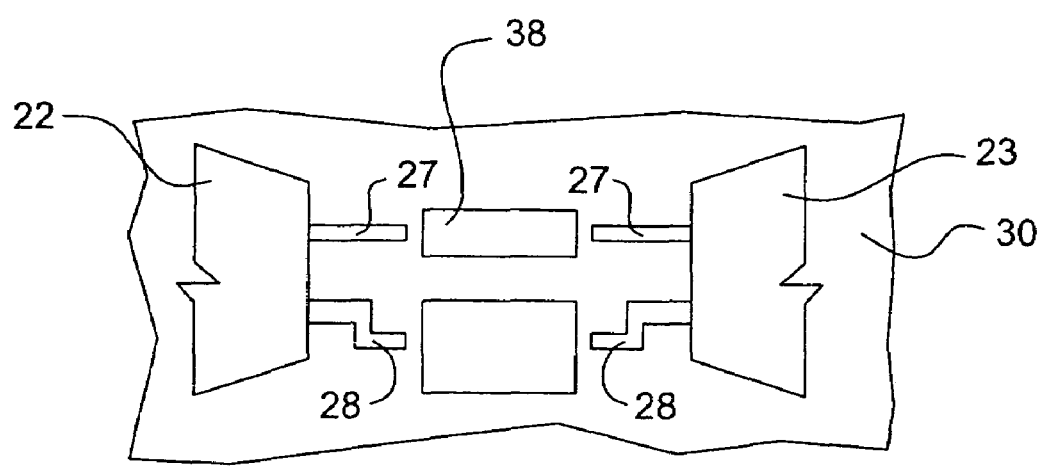

In the calibration processes of the vector network analyzer 10, referring to FIGS. 2a–d, the probes 22, 23 of the vector network analyzer 10 are connected to impedance standard circuits of an impedance standard substrate 30 which comprise an open-circuit 32, a short-circuit 34, a load-circuit 36, and a thru-circuit 38. Each of the probes 22, 23 of the vector network analyzer 10 has a signal pin 27 and a ground pin 28. The open-circuit 32, the short-circuit 34, and the load-circuit 36 comprise a couple of circuits, i.e. each of the open-circuit 32, the short-circuit 34, and the load-circuit 36 comprises two signal contacts and two ground contacts for being respectively connected to the two signal pins 27 and the two ground pins 28 of the two probes 22, 23, as shown in FIGS. 2a–c. The two ends of the thru-circuit 38 are connected to the two probes 22, 23, respectively, as shown in FIG. 2d. The couple circuits of the open-circuit 32, the short-circuit 34, and the load-circuit 36 are both disposed on the one side of the impedance standard substrate 30, or the impedance standard substrate 30 is provided with a plurality of open-circuits 32, short-circuits 34, and load-circuits 36, of which the couple circuits are both disposed on the two sides of the impedance standard substrate 30. Alternatively, the couple circuits of the open-circuit 32, the short-circuit 34, and the load-circuit 36 are disposed on both sides of the impedance standard substrate 30, respectively.

It will be apparent to those skilled in the art that the probes 22, 23 can be varied types, such as one having two ground pins disposed by the two sides of one signal pin. In this arrangement, the impedance standard circuit needs to be provided with three contacts for being in contact with the two ground pins and the signal pin.

Figure 3:
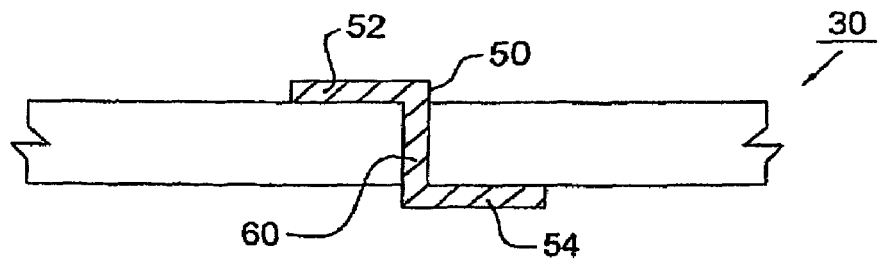
FIG. 3 is a schematic cross sectional view of a two-side thru-circuit of an impedance standard substrate according to an embodiment of the present invention.

Now referring to FIG. 3, it depicts a two-side thru-circuit 50 according a first embodiment of the present invention. The thru-circuit 50 is provided with two contacts 52, 54 disposed on the upper and lower surfaces of the impedance standard substrate 30, respectively. The contacts 52, 54 are electrically connected to each other by a via 60 through the substrate 30 so as to form a thru-circuit of an impedance standard. The contacts 52, 54 are positioned by the opposite sides of the via 60, i.e. the contacts 52, 54 are not overlapped with each other in the horizontal projection plate. It will be apparent to those skilled in the art that the contacts 52, 54 can be a signal contact or a ground contact for being connected to the signal pin or the ground pin of the probes 22, 23.

Figure 4:
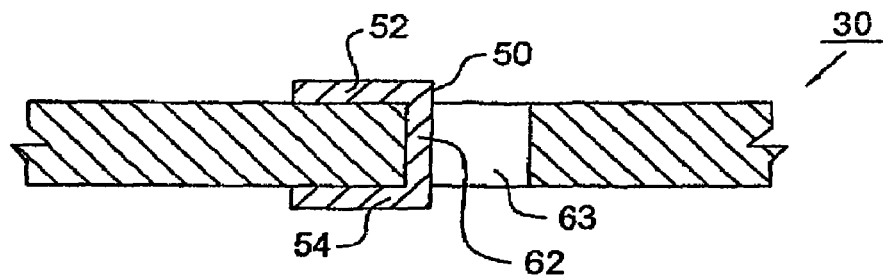
FIG. 4 is a schematic cross sectional view of a two-side thru-circuit of an impedance standard substrate according to another embodiment of the present invention.

As shown in FIG. 4, it depicts a thru-circuit 50 according a second embodiment of the present invention. The impedance standard substrate 30 is provided with a through hole 63 which, for example, is rectangular in shape. The contacts 52, 54 of the thru-circuit 50 on the upper and lower surfaces of the impedance standard substrate 30, abut against the edge of the through hole 63 and are electrically connected to each other by a trace 62 on the vertical wall of the through hole 63. As shown in the figure, the contacts 52, 54 are positioned at the same side of the through hole 63, i.e. the contacts 52, 54 are overlapped with each other in the horizontal projection plate.

Figure 5:
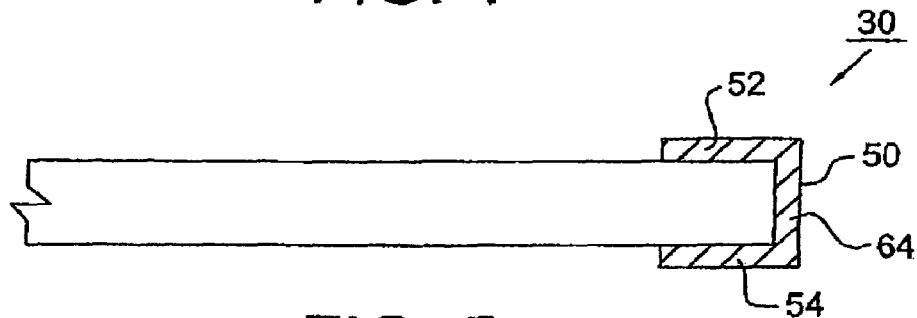
FIG. 5 is a schematic cross sectional view of a two-side thru-circuit of an impedance standard substrate according to further another embodiment of the present invention.

As shown in FIG. 5, it depicts a thru-circuit 50 according a third embodiment of the present invention. The contacts 52, 54 of the thru-circuit 50 are disposed on the upper and lower surfaces of the impedance standard substrate 30, abut against the edge of the impedance standard substrate 30, and are electrically connected to each other by a trace 64 on the vertical side wall of the impedance standard substrate 30.

Figure 6:
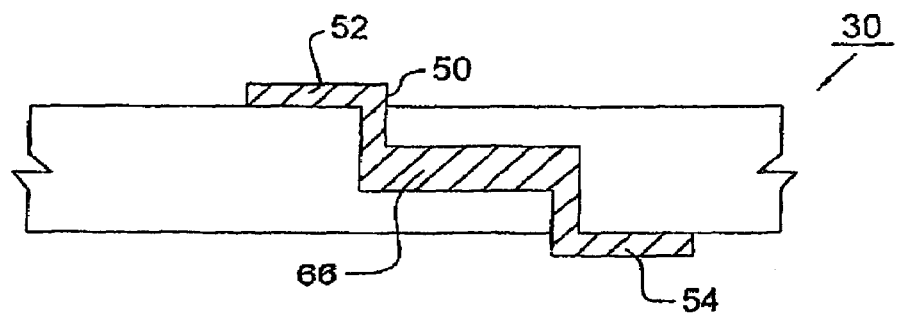
FIG. 6 is a side view of a two-side thru-circuit of an impedance standard substrate according to still another embodiment of the present invention.

As shown in FIG. 6, it depicts a thru-circuit 50 according a fourth embodiment of the present invention. The contacts 52, 54 of the thru-circuit 50 are disposed on the upper and lower surfaces of the impedance standard substrate 30, abut against the edge of the impedance standard substrate 30, and are electrically connected to each other by a trace 66 disposed by circuit layout on the vertical side wall of the impedance standard substrate 30.

Figure 7A:
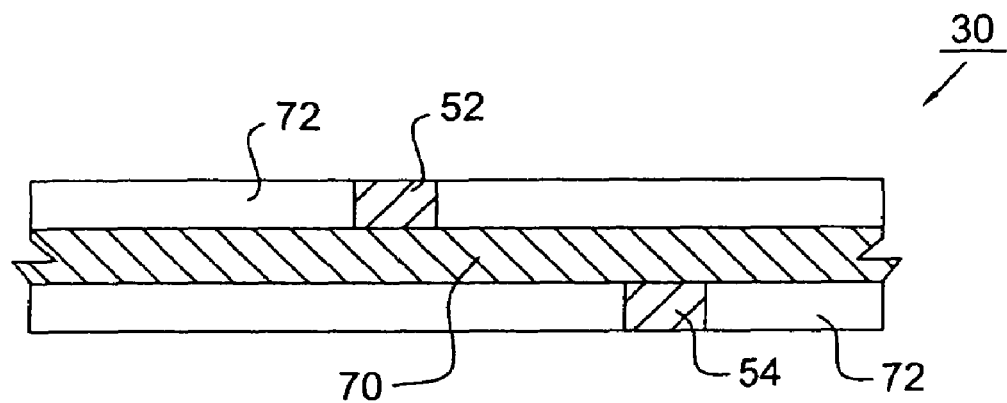
FIG. 7a is a schematic cross sectional view of a two-side thru-circuit of an impedance standard substrate according to further another embodiment of the present invention.

As shown in FIG. 7a, it depicts an impedance standard substrate 30 according a fifth embodiment of the present invention. The impedance standard substrate 30 comprises a copper core 70 and two isolation layers 72, such as made of BT resin (Bismalemide Triazine resin), respectively covering the both sides of the copper core 70. The impedance standard substrate 30 further comprises two contacts 52, 54 plated on the copper core 70, exposed out of the isolation layers 72, and electrically connected to the copper core 70 so as to form a thru-circuit.

Figure 7B:
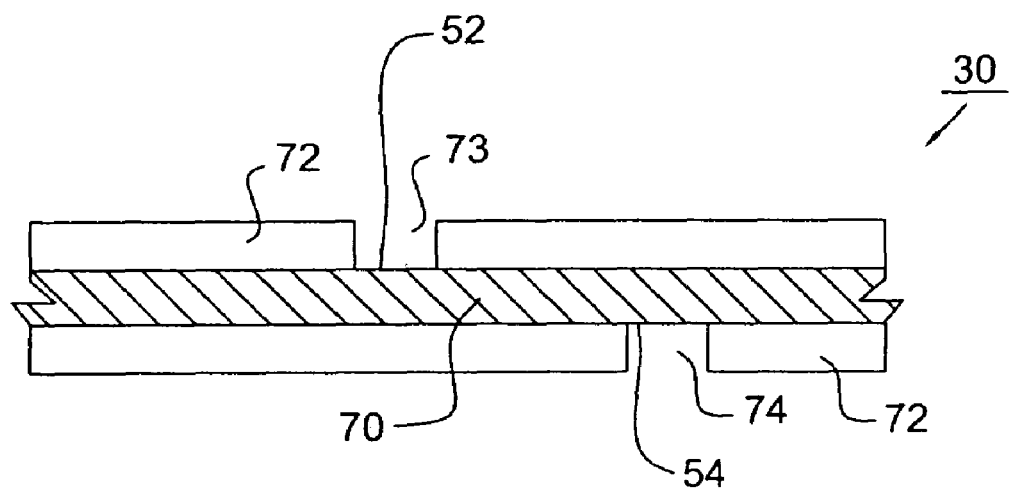
FIG. 7b is a schematic cross sectional view of a two-side thru-circuit of an impedance standard substrate according to still another embodiment of the present invention.

As shown in FIG. 7b, it depicts an impedance standard substrate 30 according a sixth embodiment of the present invention. The impedance standard substrate 30 comprises a copper core 70 and two isolation layers 72, such as made of BT resin (Bismalemide Triazine resin), respectively covering the both sides of the copper core 70. The two isolation layers 72 are provided with through holes 73, 74, respectively, which define two contacts 52, 54 for being electrically connected to the copper core 70 so as to form a thru-circuit.

As indicated in the foregoing description, the vector network analyzer can use the impedance standard substrate according to the present invention to obtain the two-side calibration data so as to directly measure the DUT with two-side contacts. Therefore, the vector network analyzer is not required to turn the probe by means of complex mechanisms and the calibration data measured is comparatively correct.

While the foregoing description and drawings represent the preferred embodiments of the present invention, it will be understood that various additions, modifications and substitutions may be made therein without departing from the spirit and scope of the principles of the present invention as defined in the accompanying claims. One skilled in the art will appreciate that the invention may be used with many modifications of form, structure, arrangement, proportions, materials, elements, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims and their legal equivalents, and not limited to the foregoing description.

What is claimed is:

1. An impedance standard substrate for calibrating a vector network analyzer, the vector network analyzer including two probes, said impedance standard substrate comprising:
   a copper core having a first surface and a second surface opposite to the first surface;
   a first isolation layer covering the first surface of the copper core;
   a second isolation layer covering the second surface of the copper core; and
   a thru-circuit having two contacts electrically connected to each other and respectively disposed on the first surface and the second surface of the copper core, wherein the contacts are adapted to electrically connect to the two probes of the vector network analyzer, respectively.

2. The impedance standard substrate as claimed in claim 1, further comprising a pair of open-circuits disposed on the first isolation layer and the second isolation layer, respectively.

3. The impedance standard substrate as claimed in claim 1, further comprising a pair of short-circuits disposed on the first isolation layer and the second isolation layer,respectively.

4. The impedance standard substrate as claimed in claim 1, further comprising a pair of load-circuits disposed on the first isolation layer and the second isolation layer, respectively.

5. The impedance standard substrate as claimed in claim 1, wherein the first and the second isolation layers are made of BT resin (Bismalemide Triazine resin).

6. The impedance standard substrate as claimed in claim 1, wherein each of the first and the second isolation layers comprises a through hole for defining the contacts of the thru-circuit.

7. The impedance standard substrate as claimed in claim 1, further comprising at least one of (a) a pair of open-circuits, (b) a pair of short-circuits, and (c) a pair of load-circuits which are disposed on the first isolation layer and the second isolation layer, respectively.

8. In combination,
   a vector network analyzer including two probes; and
   an impedance standard substrate for calibrating said vector network analyzer;
   said impedance standard substrate comprising:
   a first side;
   a second side opposite to the first side;
   a thru-circuit having two contacts electrically connected to each other and respectively disposed on the first side and the second side, wherein the contacts are electrically connectable and physical contactable with the two probes of the vector network analyzer, respectively.

9. The combination of claim 8, wherein said impedance standard substrate further comprises:
   at least one of (a) a pair of open-circuits, (b) a pair of short-circuits, and (c) a pair of load-circuits which are disposed on the first side and the second side, respectively.

10. The combination of claim 9, wherein said impedance standard substrate further comprises:
    a copper core having a first surface on the first side and a second surface on the second side;
    a first isolation layer covering the first surface of the copper core;
    a second isolation layer covering the second surface of the copper core; and
    wherein the contacts of said thru-circuit are respectively disposed on the first surface and the second surface of the copper core.

11. The combination of claim 8, wherein said impedance standard substrate further comprises:
    a copper core having a first surface an the first side and a second surface on the second side;
    a first isolation layer covering the first surface of the copper core;
    a second isolation layer covering the second surface of the copper core; and
    wherein the contacts of said thru-circuit are respectively disposed on the first surface and the second surface of the copper core.

* * * * *